(12) United States Patent
Zbrozek et al.

(10) Patent No.: US 9,069,060 B1
(45) Date of Patent: Jun. 30, 2015

(54) CIRCUIT ARCHITECTURE FOR OPTICAL RECEIVER WITH INCREASED DYNAMIC RANGE

(71) Applicant: Google Inc., Mountain View, CA (US)

(72) Inventors: Alexander Zbrozek, Mountain View, CA (US); Pierre-Yves Droz, Mountain View, CA (US); Asheem Linaval, Fremont, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/802,561

(22) Filed: Mar. 13, 2013

(51) Int. Cl.
*G01C 3/08* (2006.01)
*G01S 7/481* (2006.01)
*H03F 3/08* (2006.01)

(52) U.S. Cl.
CPC .. *G01S 7/481* (2013.01); *H03F 3/08* (2013.01)

(58) Field of Classification Search
CPC ........ G01C 3/08; G01C 15/002; G01S 17/89; G01S 7/4817; G01S 17/42
USPC .................. 356/3.01, 4.01, 4.07, 5.01, 9, 625
See application file for complete search history.

(56) References Cited

U.S. PATENT DOCUMENTS

| | | | |
|---|---|---|---|
| 3,671,931 A * | 6/1972 | Loofbourrow | 367/67 |
| 3,790,277 A | 2/1974 | Hogan | |
| 4,215,930 A * | 8/1980 | Miyakawa et al. | 399/47 |
| 4,700,301 A | 10/1987 | Dyke | |
| 4,709,195 A | 11/1987 | Hellekson et al. | |
| 5,202,742 A | 4/1993 | Frank et al. | |
| 5,923,462 A | 7/1999 | van der Plaats | |
| 6,619,866 B1 | 9/2003 | Sun et al. | |
| 6,844,924 B2 | 1/2005 | Ruff et al. | |
| 6,943,940 B2 | 9/2005 | Kinoshita et al. | |
| 7,089,114 B1 | 8/2006 | Huang | |
| 7,158,729 B2 | 1/2007 | Yokomizo | |
| 7,248,342 B1 | 7/2007 | Degnan | |
| 7,255,275 B2 | 8/2007 | Gurevich et al. | |
| 7,394,995 B2 | 7/2008 | Audic et al. | |
| 7,414,715 B2 | 8/2008 | Wolters et al. | |
| 7,652,752 B2 | 1/2010 | Fetzer et al. | |
| 7,830,442 B2 | 11/2010 | Griffis et al. | |
| 7,830,527 B2 | 11/2010 | Chen | |
| 7,907,333 B2 | 3/2011 | Coyle | |
| 7,969,558 B2 | 6/2011 | Hall | |
| 8,242,428 B2 | 8/2012 | Meyers et al. | |

(Continued)

OTHER PUBLICATIONS

Mitchell, P., "Development of a high speed wideband frequency tunable infra-red laser source for real-time wind turbine array sensing applications," Renewable Energy 36 (2011) 3472-3478.

*Primary Examiner* — Luke Ratcliffe
*Assistant Examiner* — Samantha K Abraham
(74) *Attorney, Agent, or Firm* — McDonnell Boehnen Hulbert & Berghoff LLP (57) ABSTRACT

A circuit architecture for a sensing component of a Light Detection and Ranging (LIDAR) device can provide a wide dynamic range. The circuit architecture includes at least one photosensor, each photosensor including an input that is configured to receive an optical signal; a respective diode corresponding to each photosensor, each respective diode including an input that is coupled to an output of the corresponding photosensor; a multiplexer including an input that is coupled to the output of each of the at least one photosensors; and an amplifier including an input that is coupled to the output of the multiplexer.

23 Claims, 8 Drawing Sheets

(56) References Cited

U.S. PATENT DOCUMENTS

| | | | |
|---|---|---|---|
| 2002/0161289 A1* | 10/2002 | Hopkins et al. | 600/322 |
| 2006/0146159 A1* | 7/2006 | Farrier | 348/308 |
| 2007/0258722 A1* | 11/2007 | Yu | 398/212 |
| 2011/0116072 A1 | 5/2011 | Rousseau | |
| 2011/0164783 A1 | 7/2011 | Hays et al. | |
| 2011/0194099 A1 | 8/2011 | Kamiyama | |
| 2012/0177368 A1 | 7/2012 | Aoki | |
| 2012/0193519 A1 | 8/2012 | Oomori | |

* cited by examiner

CIRCUIT ARCHITECTURE FOR OPTICAL RECEIVER WITH INCREASED DYNAMIC RANGE

BACKGROUND

Unless otherwise indicated herein, the materials described in this section are not prior art to the claims in this application and are not admitted to be prior art by inclusion in this section.

Light Detection and Ranging (LIDAR) is an optical remote sensing technology that may be utilized to acquire information on an environment. The acquired information may include the distances to, or other properties of, objects in the environment. A LIDAR device may use laser light in a range of wavelengths/frequencies, e.g., ultraviolet, visible, or infrared, to illuminate and acquire information on a variety of different types of objects, such as metallic and non-metallic items, geological formations, and even atmospheric elements.

In operation, a LIDAR device may be configured to illuminate a surrounding environment with light, detect light reflected off of objects within the environment, and determine object information based on the reflected light. In some environments, objects may be far away from the LIDAR device and thus the light must travel a long distance (both from the LIDAR to the object, and from the object back to the LIDAR). Because the light must travel a long distance, the reflected light is often significantly attenuated by the time it returns to the LIDAR device. Thus, a signal corresponding to a near object may be many times stronger than a signal corresponding to a far object.

Nonetheless, the sensing component of a LIDAR device is typically arranged to respond linearly to detected light. Such arrangements may be characterized by a small dynamic range; that is, the LIDAR device may only be capable of detective objects over small distances. Because the distance of objects in an environment, and thus the magnitude of signals received by the LIDAR device, may differ dramatically, however, such a small dynamic range is undesirable.

SUMMARY

A LIDAR device may include a circuit architecture that helps increase the dynamic range of its sensing component. The circuit architecture may include various photosensors. A given photosensor may be configured to receive a light signal, and to convert the light signal to an electrical signal. The circuit architecture may include various components that dynamically control the magnitude of the electrical signal. For instance, the given photosensor may be coupled to a diode that regulates the magnitude of the current of the electrical signal. In turn, the circuit architecture may also include various other components including, for example, an amplifier. The amplifier may generally amplify the electrical signal provided by the given photosensor. However, because the electrical signal is dynamically controlled, the amplifier may avoid saturation at light levels that may otherwise cause saturation.

In this way, the circuit architecture may help provide for a larger dynamic range of a LIDAR device. That is, the circuit architecture may help the LIDAR device to sense the presence of objects over an increased range of distances.

In a first aspect, a circuit may include at least one photosensor, each photosensor including an input that is configured to receive an optical signal; a respective diode corresponding to each photosensor, each respective diode including an input that is coupled to an output of the corresponding photosensor; a multiplexer including an input that is coupled to the output of each of the at least one photosensor; and an amplifier including an input that is coupled to the output of the multiplexer.

In a second aspect, a light-detection and ranging (LIDAR) device may include at least one laser diode, wherein the at least one laser diode is configured to emit a light signal in a defined wavelength range; at least one photosensor, each photosensor including an input that is configured to receive a light signal having wavelengths in the defined wavelength range; a respective diode corresponding to each photosensor, each respective diode including an input that is coupled to an output of the corresponding photosensor; a multiplexer including an input that is coupled to the output of each of the at least one photosensor; and an amplifier including an input that is coupled to the output of the multiplexer.

In a third aspect, a circuit may include one, and only one, photosensor, the photosensor including an input that is configured to receive an optical signal; a respective diode corresponding to the photosensor, the respective diode including an input that is coupled to an output of the photosensor; and an amplifier including an input that is coupled to the output of the photosensor.

These as well as other aspects, advantages, and alternatives, will become apparent to those of ordinary skill in the art by reading the following detailed description, with reference where appropriate to the accompanying drawings.

DETAILED DESCRIPTION

In the following detailed description, reference is made to the accompanying figures, which form a part thereof. In the figures, similar symbols typically identify similar components, unless context dictates otherwise. The illustrative embodiments described in the detailed description, figures, and claims are not meant to be limiting. Other embodiments may be used, and other changes may be made, without departing from the spirit or scope of the subject matter presented herein. It will be readily understood that the aspects of the present disclosure, as generally described herein and illustrated in the figures, can be arranged, substituted, combined, separated, and designed in a wide variety of different configurations, all of which are contemplated herein.

I. EXAMPLE CIRCUIT ARCHITECTURE

Described herein are aspects of an example circuit architecture that may be arranged, generally, to provide a larger dynamic range for a signal receiver, including a signal receiver for use in a detection and ranging system. In an example implementation, the circuit architecture may be part of a light-detection and ranging (LIDAR) device. For sake of explanation, the example circuit architecture and an example LIDAR device will be discussed as separate systems. It should be understood, however, that the circuit architecture may be integrated into the LIDAR device (e.g., the circuit architecture may be a subsystem of the LIDAR device) without departing from the present invention. Furthermore, it should be understood that the circuit architecture and/or the LIDAR device may include one or more circuits and/or other elements not explicitly discussed herein. It should also be understood that the circuit architecture may be integrated into other systems, including other signal receivers.

In some implementations, the circuit architecture may be integrated with or otherwise coupled to an autonomous vehicle, such as a driverless automobile that is configured to analyze its surrounding environment based on a point cloud (i.e., three-dimensional spatial-point data) obtained by a LIDAR. It should be understood that the autonomous vehicle may be fully autonomous or partially autonomous. In a partially autonomous vehicle, some functions may be manually controlled (e.g., by a person) some or all of the time. Further, a partially autonomous vehicle could be configured to switch between a fully-manual operation mode and a partially- or fully-autonomous operation mode.

Figure 1A:
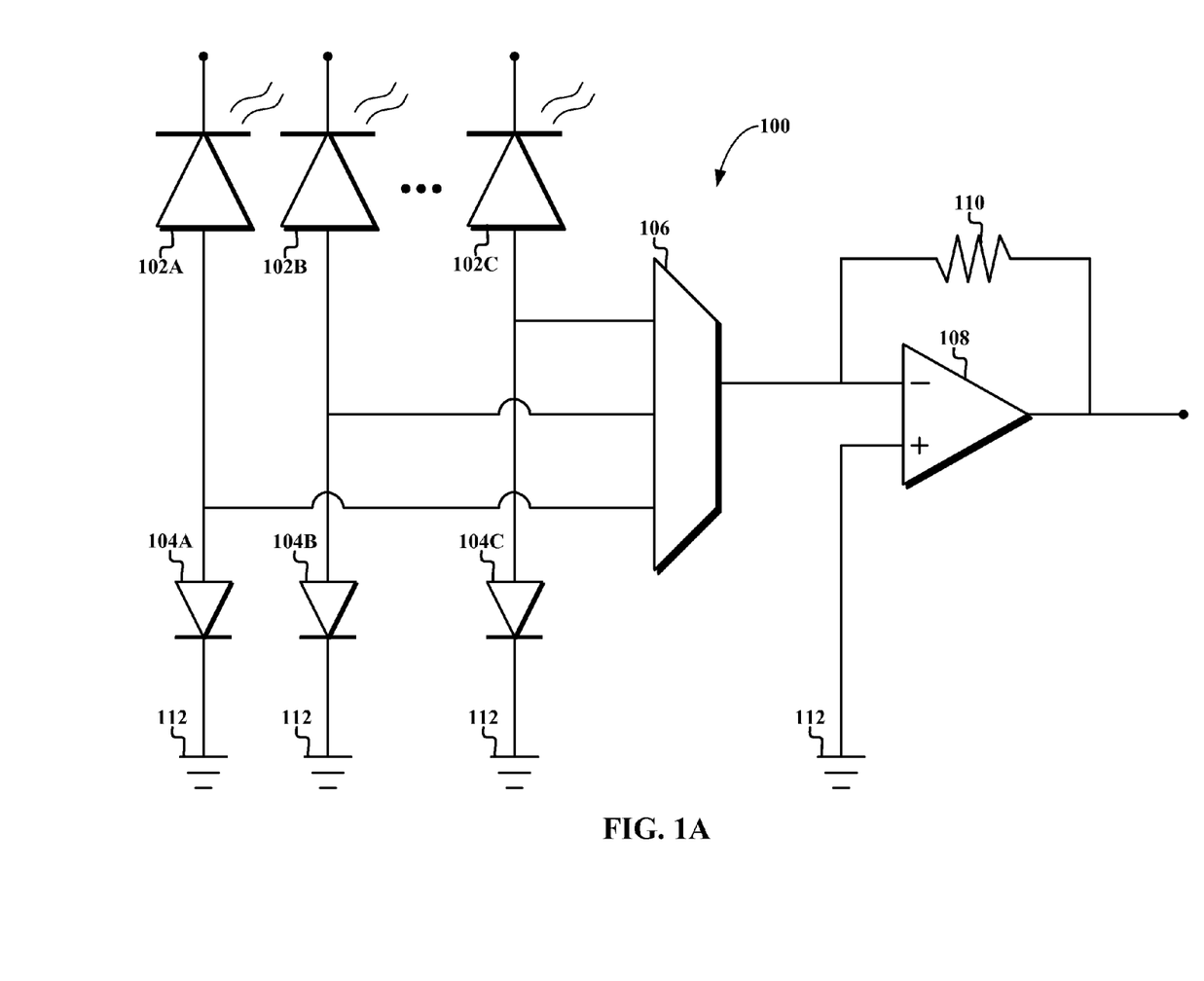
FIG. 1A shows a simplified block diagram of functional elements included in a first example circuit architecture.

FIG. 1A depicts a simplified block diagram of functional elements included in an example circuit architecture 100. According to an embodiment, the dynamic circuit architecture 100 may include photosensors 102A-C, diodes 104A-C, ground 112, multiplexer (MUX) 106, amplifier 108, and resistor 110. Although the various elements of the circuit architecture 100 may be described herein as separate elements, it should be understood that the elements could just as well be physically integrated together or distributed in any suitable manner. Further additional and/or alternative elements may be included as well.

Each photosensor 102A-C may be any suitable device that is capable of detecting the presence of light. Photosensors 102A-C may be configured to detect particular wavelengths/frequencies of light, e.g., ultraviolet, visible, and/or infrared. Further, photosensors 102A-C may be configured to convert a light signal into an electrical signal represented by current and/or voltage. Example photosensors may include photodiodes, bipolar phototransistors, light emitting diodes and photosensitive field-effect transistors, among other examples. In one implementation, at least one photosensor may be an avalanche photodiode.

One example of a photosensor that may be used in accordance with the example circuit architecture is a model SAE500NS avalanche photodiode manufactured by Laser Components®. Other examples may exist.

It should be noted that although FIG. 1A depicts three photosensors, this is not necessary. The circuit architecture 100 may include any suitable number of photosensors. As one example, circuit architecture 100 may include one photosensor. As another example, circuit architecture 100 may include ten photosenstors. As another example, circuit architecture 100 may include 64 photosensors. Other quantities of photosensors are also possible. Further, each individual photosensor may include multiple photosensors.

Each diode 104A-C may be configured to act as a current "gate," i.e., a device that regulates the flow of electric current. For example, each diode 104A-C may be configured such that, under certain conditions, electric current is permitted to flow in one direction but is prevented from flowing in the opposite direction. Diodes 104A-C may be semiconductor diodes and/or vacuum tube diodes, among other types of diodes. More specifically, diodes 104A-C may be point-contact diodes, p-n junction diodes, and/or Schottky diodes. Furthermore, the diodes 104A-C may be configured to have a particular voltage bias, such that when the voltage bias is applied across a diode, the diode is turned "on" (i.e., current passes through the diode), and until the voltage bias is applied to the diode, the diode is turned "off" (i.e., current does not pass through the diode). Example bias values include 0.2 Volts, 0.3 Volts, and 0.7 Volts. Other bias values are also possible.

As noted above, additional and/or alternative elements may be included in the example circuit architecture set forth in FIG. 1A. As one particular example, one or more of each of diodes 104A-C may have a respective resistor connected in parallel to the diode. Such a resistor may operate to add a linear characteristic to the otherwise logarithmic response of the diode. Moreover, use of such a resistor may enable additional control over, or tuning of, the response of the circuit architecture.

One example of a diode that may be used in accordance with the example circuit architecture is a model 1PS10SB82 Schottky barrier diode manufactured by NXP Semiconductors N.V.®. Other examples may exist.

MUX 106 may be any suitable device capable of selecting one of several input signals and outputting the selected signal as a single output signal. Accordingly, the MUX 106 may be an analog or digital device. MUX 106 may include $2^n$ inputs, at least one output, and n select lines (not depicted), which may be used to select what input signal is passed to the at least one output. Applying a voltage or a current to a particular select line, or combination of select lines, may determine which input signal MUX 106 outputs at a given time.

One example of a MUX that may be used in accordance with the example circuit architecture is a model PI2PCIE2214 MUX manufactured by Pericom®. Other examples may exist.

Generally, amplifier 108 may be any suitable device that is configured to increase, convert or otherwise alter an electrical signal. For example, amplifier 108 may be a differential amplifier, an operational amplifier, a fully differential amplifier, or a negative feedback amplifier, among other amplifier types. Amplifier 108 may include at least one input, at least one output, and may have a specified gain value. In one embodiment, the amplifier 108 may be a trans-impedance amplifier. The trans-impedance amplifier may be any suitable amplifier capable of converting a current signal, e.g., current originally generated by a photosensor, into a voltage signal. Other types of amplifiers are also possible.

One example of an amplifier that may be used in accordance with the example circuit architecture is a model LTC6409 differential amplifier manufactured by Linear Technology®. Other examples may exist.

Additionally, amplifier 108 may include a feedback loop, which connects an amplifier output to an input of amplifier 108. As depicted, the feedback loop may be a negative feedback loop. In other embodiments, for instance where a comparator is used in place of amplifier 108, the feedback loop may be a positive feedback loop. The feedback loop may include at least one circuit element, e.g., a resistor, a capacitor, an inductor, and/or a diode among other circuit elements. It is of note that, if desired, inclusion of a diode in the feedback loop may enable the amplifier to exhibit logarithmic behavior. For example, as depicted, the negative feedback loop may include resistor 110. Amplifier 108 may include an output that is coupled to the input of another component/system, for example, an analysis element of a LIDAR device.

Returning now to photosensors 102A-C, in operation, the photosensors may receive an optical signal. For example, each photosensor may be a photodiode configured to detect a reflected laser beam. As shown in FIG. 1A, each photosensor 102A-C may have a corresponding respective diode 104A-C (which, for purposes of example and explanation, may collectively be referred to as a "photosensor-diode pair"). For instance diode 104A corresponds to the photosensor 102A, diode 104B corresponds to photosensor 102B, and diode 104C corresponds to the photosensor 102C. Each respective diode 104A-C may include an input that is coupled to an output of a corresponding photosensor. For instance the input to diode 104A may be connected to the output of photosensor 102A, the input to diode 104B may be connected to the output of photosensor 102B, and the input to diode 104C may be connected to the output of photosensor 102C. Each diode 104A-C may include an output that is coupled to ground 112.

MUX 106 may include an input that is coupled to the output of each of photosensors 104A-C. In turn, amplifier 108 may include an input that is coupled to the output of MUX 106 and an input that is coupled to ground 112. As shown in FIG. 1A, the input of amplifier 108 coupled to the output of the MUX 106 may be a negative input. In other implementations, the input of amplifier 108 that is coupled to the output of the MUX 106 may be a positive input.

Notably, MUX 106 appears before amplifier 108 in the circuit flow. As a result, a given electrical signal is multiplexed prior to amplification. In other arrangements, the electrical signal corresponding to each photosensor may be amplified prior to being multiplexed. Thus, the example architecture shown in FIG. 1A advantageously includes only a single amplifier (or a reduced number of amplifiers compared to other arrangements). In the example arrangement shown in FIG. 1A, for example, only single MUX 106 is required. One circuit element that helps increase the dynamic range of a given photosensor 102A-C is the corresponding respective diode 104A-C.

For example, consider photosensor 102A and corresponding diode 104A. In operation, photosensor 102A may receive an optical signal, e.g., a reflected laser light beam at the input of the photosensor. Photosensor 102A may convert the optical signal into an electrical current. As noted above, in an example implementation, photosensor 102A may be an avalanche photodiode (APD). In APDs, incoming photons generally trigger a charge avalanche. Typically, a reverse bias voltage is applied to the APD, and charge carriers set free by light produce even further charge carriers through impact ionization. The current generated by this avalanche process may be described by Equation 1:

$$I = R_0 \times M \times P_S \qquad \text{Equation 1}$$

where $R_0$ is the spectral sensitivity of the APD, M is the internal gain of the APD, and $P_S$ is the incident optical power. The gain M of the APD is correlated to the applied reverse bias voltage.

At relatively low light power levels (and thus low currents provided by photosensor 102A), diode 104A may pass relatively low amounts of current, and thus a relatively large amount of the current generated by the APD will proceed to MUX 106 and, ultimately, amplifier 108. However, at relatively high light levels (and thus high currents provided by photosensor 102A), diode 104A may pass relatively high amounts of current and thus a relatively small amount of the current generated by the APD will be passed through diode 104A to ground 112, while the rest of the current will proceed to MUX 106 and amplifier 108. In this way, the circuit architecture 100 set forth in FIG. 1A helps avoid oversaturation at relatively high light levels, while still being capable of sensing relatively low light levels.

In an example implementation, diode 104A may generally operate according to the Shockley ideal diode equation (also known as the diode law). The Shockley diode equation generally provides the current-voltage characteristics of an ideal diode as described by Equation 2:

$$I = I_S \times \left( e^{V_D/(nV_T)} - 1 \right) \qquad \text{Equation 2}$$

where I is the diode current, $I_S$ is the reverse bias saturation current (or scale current), $V_D$ is the voltage across the diode, $V_T$ is the thermal factor, and n is the ideality factor (also known as the quality factor). The ideality factor n may vary from 1 to 2 (though may be even higher), depending on the fabrication process and material of the diode. The diode current I, as passed to ground, may generally increase logarithmically depending on the reverse bias saturation current $I_S$ received from the photosensor (and, thus, based on the power of the incident light).

While certain aspects of example implementations of photosensor 102A and diode 104A are discussed above, it should be understood that this is for purposes of example and explanation only. These examples should not be taken to be limiting.

As shown, MUX 106 may include multiple inputs, where each input may correspond to a particular photosensor output, e.g., the output of photosensor 102A. When only one photosensor-diode pair is in operation, (e.g., photosensor 102A and corresponding diode 104A) the current signal may pass through MUX 106 to the amplifier 108. When multiple photosensor-diode pairs are in operation (e.g., photosensor 102B and corresponding diode 104B, photosensor 102C and corresponding diode 104C, etc.), MUX 106 may receive multiple current signals at the multiple inputs. As discussed above, MUX 106 may include select lines. Depending on which current signal is desired (i.e., what photosensor output signal should be sent to the amplifier 108), a voltage or a current may be applied to a particular select line or lines. As a result, MUX 106 may output the desired current signal to amplifier 108.

Amplifier 108 may receive at one of its inputs the signal output by MUX 106. As noted, in the example implementation shown in FIG. 1A, the amplifier 108 may receive the signal at the negative input. In other embodiments, the amplifier 108 may receive the signal at the positive input. Amplifier 108 may then amplify the received signal into an output signal. The output signal may then be sent to another component and/or system, e.g., a LIDAR system.

The feedback loop may receive the voltage signal and consequently pass a feedback current signal to an input of the amplifier 108. In one implementation, as depicted, the feedback loop may be a negative feedback loop that includes resistor 110. The negative feedback loop may operate to stabilize the circuit architecture 100. Alternatively, the feedback loop may be a positive feedback loop, which may operate to move circuit architecture 100 away from an equilibrium state. In yet other implementations, the circuit architecture 100 may not include feedback loop and/or resistor 110.

It is of note that, in other implementations, the circuit architecture 100 may include only one photosensor-diode pair (e.g., photosensor 102A and corresponding diode 104A), ground, and an amplifier (e.g., the amplifier 108). Because there is only a single photosensor-diode pair, a MUX may generally be unnecessary. In operation, a current signal may pass from a photosensor to the input of the amplifier, with the diode providing a logarithmic response as discussed above.

Figure 1B:
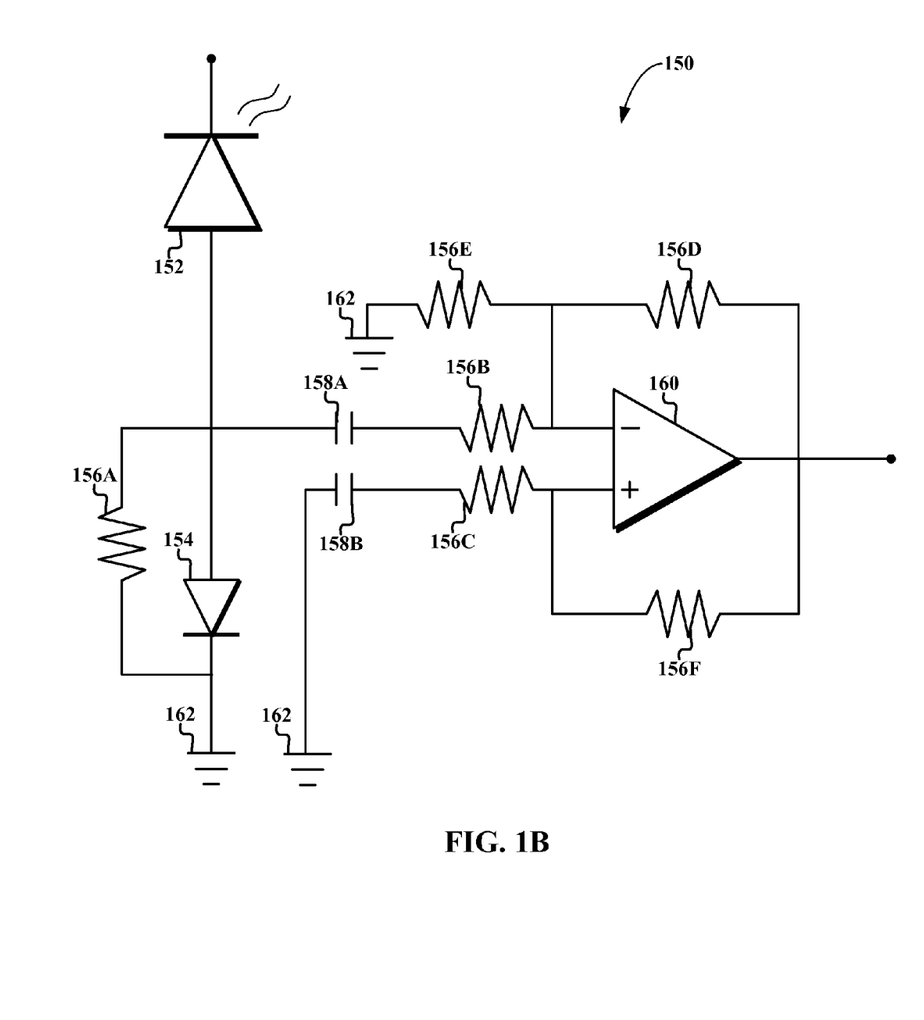
FIG. 1B shows a simplified block diagram of functional elements included in a second example circuit architecture.

A particular example of a circuit architecture 150 implemented with a single photosensor-diode pair is provided in FIG. 1B. Example circuit architecture 150 includes photosensor 152, diode 154, resistors 156A-E, capacitors 158A-B, amplifier 160, and ground 162. In an embodiment, resistors 156A and 156E may be 2K ohms, resistors 156B and 156C may be 400 ohms, and resistors 156D and 156F may be 10K ohms. And capacitors 158A and 158B may be 1 nanoFarad.

It should be understood, however, that the particular example set forth in FIG. 1B is but one additional example implementation of the circuit architecture, and should not be taken to be limiting. Moreover, the specific circuit elements depicted, including the values thereof, or only examples and should not be taken to be limiting. Further, additional and/or alternative elements may be included as well.

Other configurations are also possible.

II. EXAMPLE LIDAR OVERVIEW

As discussed above, the example circuit architecture shown in FIG. 1A may be added to or otherwise integrated with a LIDAR device. Generally, the LIDAR device may include any sensor configured to sense objects in the environment in which the LIDAR device is located using lasers. The circuit architecture described above may generally be incorporated within, or otherwise be coupled to, such a sensor. Depending upon the implementation, the LIDAR device may also include, for example, one or more laser sources and a scanning element, among other system components.

As a general matter, the LIDAR device may be used to detect objects near and/or around the LIDAR device. In an implementation, the LIDAR device may redirect a laser beam using one or more scanning elements (e.g., a mirror), among other components. Such a scanning element may be configured so as to be rotatable about its axis; accordingly the laser beam may be directed in a circular range of motion about the LIDAR device.

The LIDAR device may regularly emit the laser beam, and suitable sensors/detectors may receive reflections of the laser beam off of objects in the environment. The LIDAR device may be configured to have any desirable viewing angle, including any viewing angle up to and including 360 degrees. And, as noted, the LIDAR device may include various sensors and/or circuits (e.g., the circuit architecture 100) arranged to detect the reflection of the laser beam off of various objects at various distances in the environment. In this way, the LIDAR device may operate in an environment so as to receive spatial-point data corresponding to the environment.

Figure 2A:
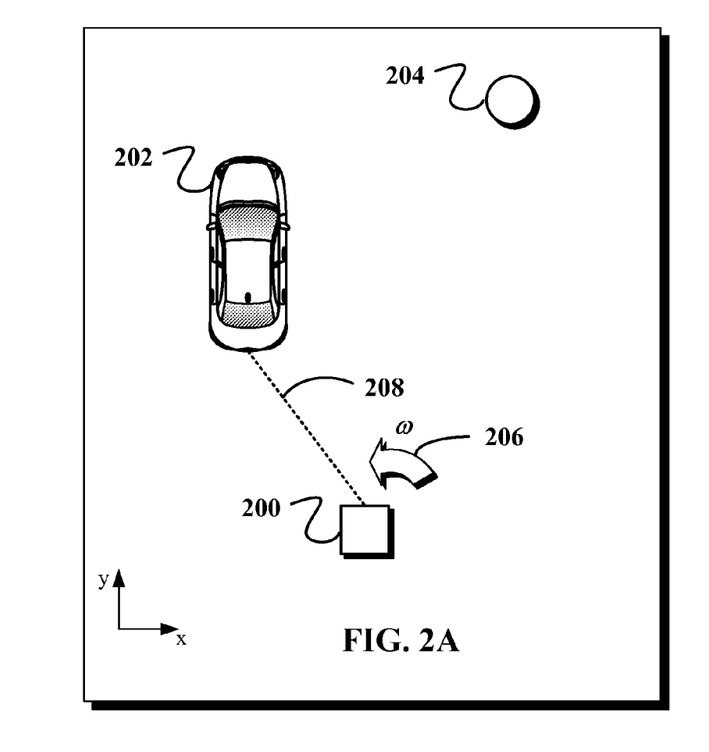
FIG. 2A shows an example scenario in which a LIDAR device scans an environment that includes two objects.
Figure 2B:
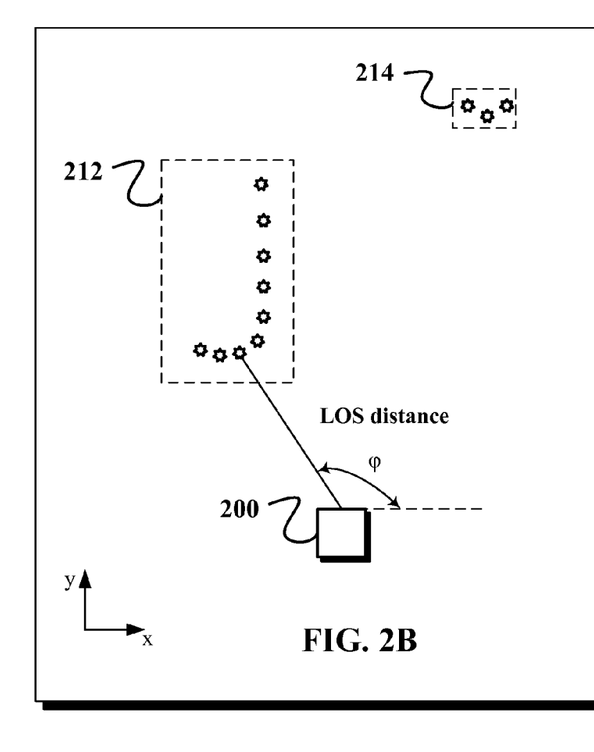
FIG. 2B shows an example point cloud for the two objects scanned in the scenario shown in FIG. 2A.

FIGS. 2A and 2B show an example application of a LIDAR device 200, which could have integrated within it, or could otherwise be communicatively coupled to, the circuit architecture shown in FIGS. 1A and 1B. In this example application, LIDAR device 200 is used to scan an environment that includes a road. Thus, LIDAR device 200 could be in a vehicle, such as an autonomous vehicle, that is traveling on the road. The environment of LIDAR device 200 in this example includes another vehicle 202 and a road sign 204. To scan through the environment, LIDAR device 200 rotates a scanning element, which could be a mirror, according to motion reference arrow 206 with angular velocity ω. While rotating, LIDAR device 200 regularly (e.g., periodically) emits pulsed laser beams, such as laser beam 208. Light from the emitted laser beams is reflected by objects in the environment, such as vehicle 202 and sign 204, and are detected by one or more detectors in LIDAR device 200. Time-stamping the receipt of the reflected signals allows for associating each reflected signal (if any is received at all) with the most recently emitted laser pulse and measuring the time delay between emission of the laser pulse and reception of the reflected light. The time delay provides an estimate of the distance to the reflective feature based on the speed of light in the intervening atmosphere. Combining the distance information for each reflected signal with the orientation of scanning element in LIDAR device 200 for the respective pulse emission allows for determining a position of the reflective feature in three-dimensions.

FIG. 2B shows an example point cloud resulting from LIDAR device 200 scanning the environment shown in FIG. 2A. For purposes of illustration, the scan is assumed to be in an x-y plane that is generally horizontal (e.g., parallel to the surface of the road). It is to be understood, however, that the scan could include a vertical component (z-dimension) as well. In this example, the point cloud includes spatial points 212 corresponding to reflections from vehicle 202 and spatial points 214 corresponding to reflections from sign 204. Each spatial point in the point cloud has a line of sight ("LOS") distance from LIDAR device 200 and an azimuthal angle φ in the x-y plane. In this way, the scanning by LIDAR 200 can provide information regarding the locations of reflective objects in its environment.

Figure 3A:
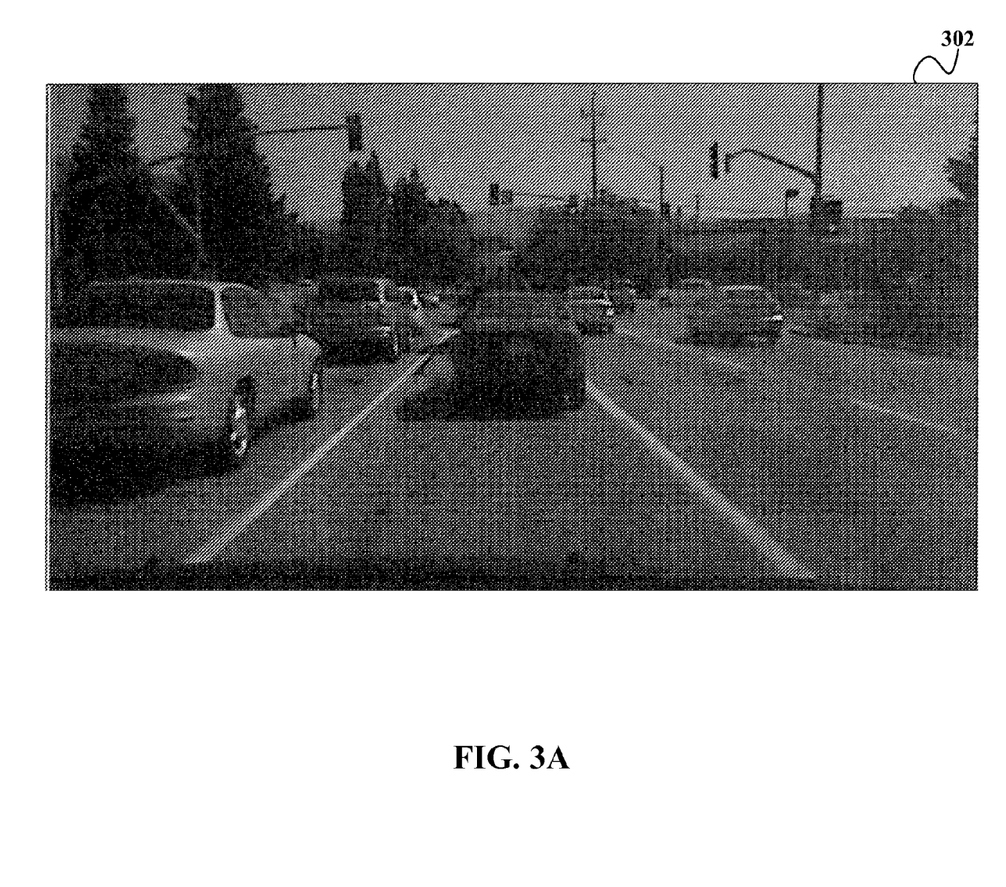
FIGS. 3A-3D show various example images and corresponding example spatial-point data.
Figure 3B:
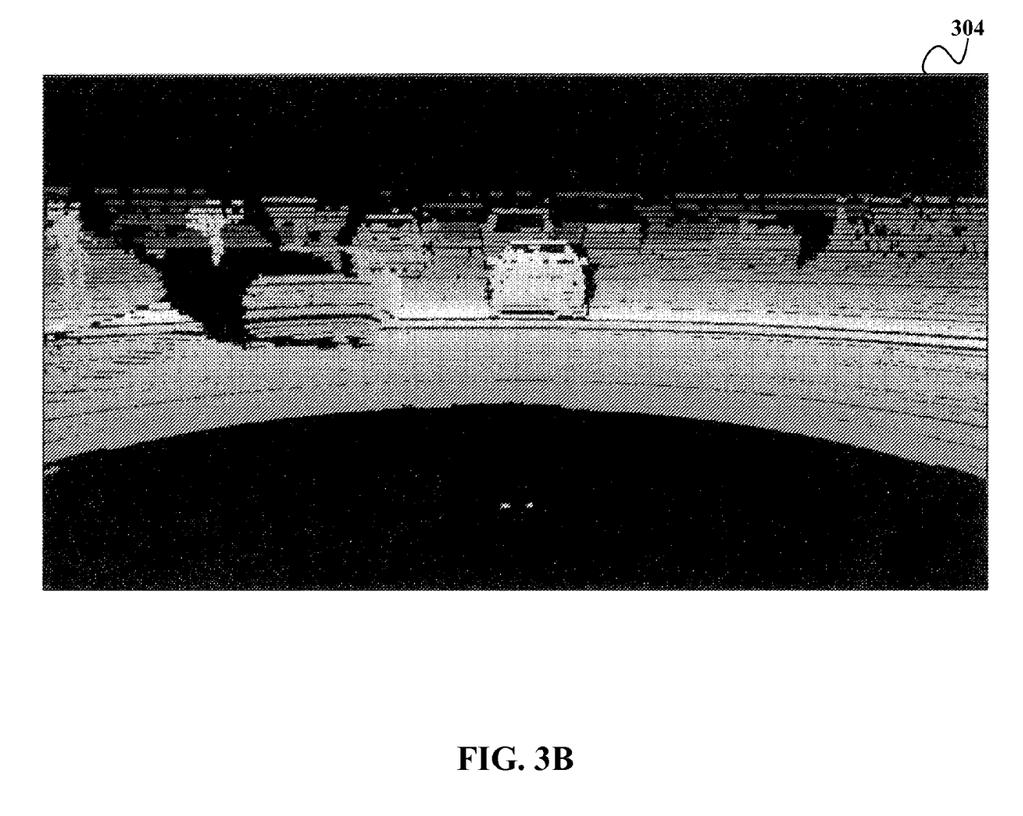
Figure 3C:
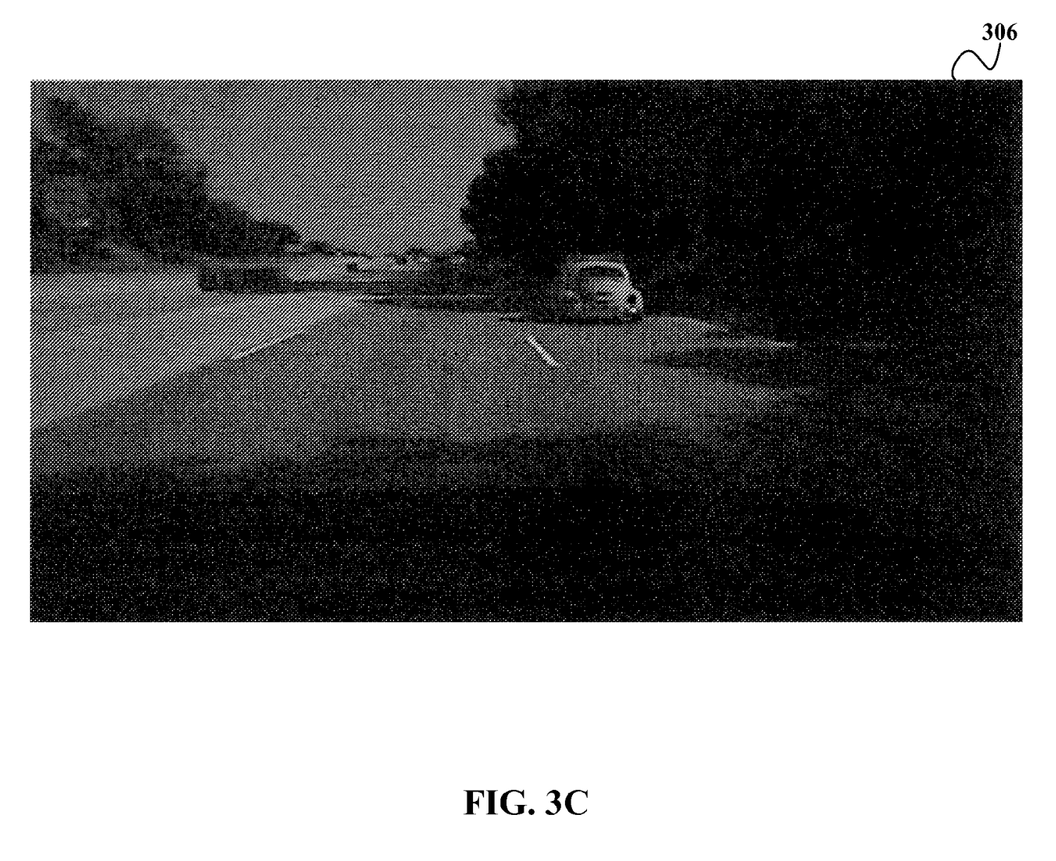
Figure 3D:
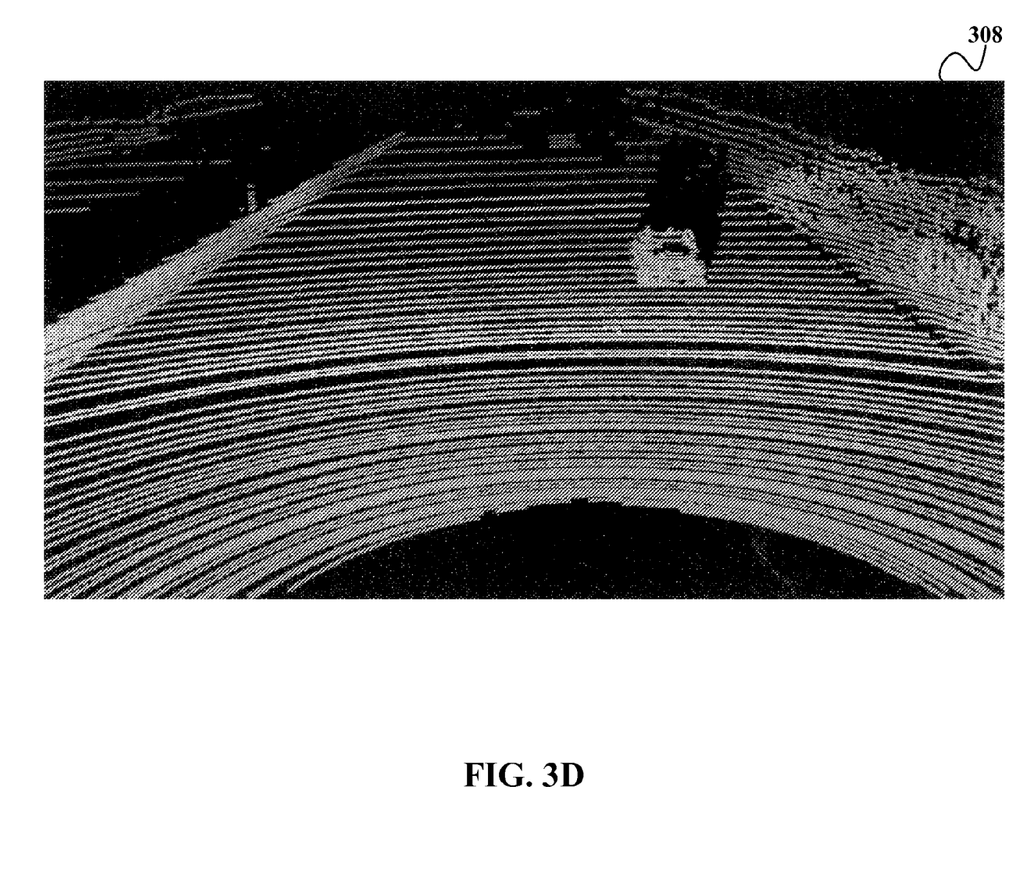

As spatial-point data is captured by the LIDAR device, the data may be communicated to an object detector, which may analyze the image to determine whether there is an object present in the environment. The object in the captured spatial-point data may be any type of object including, for example, a vehicle, pedestrian, road sign, traffic light, or traffic cone, among other examples FIGS. 3A-3D are examples of various images and corresponding spatial-point data that may be captured by the LIDAR device. FIG. 3A is a first example of a raw camera image 302 captured by a camera. FIG. 3B includes an example laser point cloud image 304 of the view shown in the first raw camera image 302. FIG. 3C is a second example of a raw camera image 306 captured by a camera. FIG. 3D includes an example laser point cloud image 308 of the view shown in raw camera image 306.

As shown in the examples of FIGS. 3B and 3D, in some respects, a laser point cloud image may substantially or approximately correspond to a raw camera image captured by a camera. Moreover, FIGS. 3B and 3D show that the LIDAR device may be configured to capture more than one type of laser point cloud image. The LIDAR device may also be configured to capture other types of perspectives using other types of sensors as well.

III. EXAMPLE LIDAR DEVICE

Figure 4:
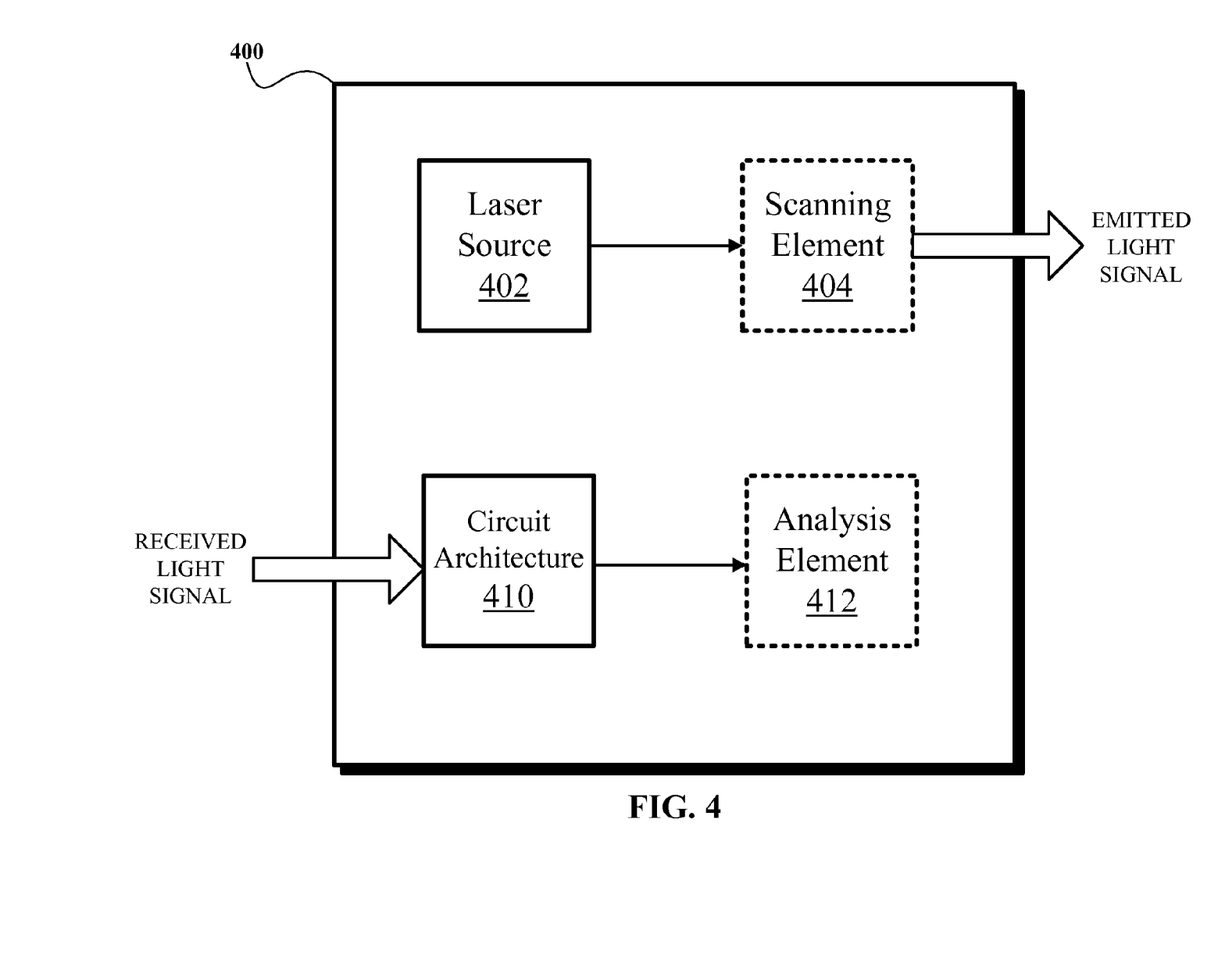
FIG. 4 shows a simplified block diagram of an example LIDAR device.

FIG. 4 depicts a simplified block diagram of a LIDAR device 400, according to an example embodiment. LIDAR device 400 may include laser source 402 and circuit architecture 410. The circuit architecture 410 may be the same as, or similar to, the example circuit architecture discussed above with respect to FIGS. 1A and 1B. Accordingly, circuit architecture 410 may include, e.g., photosensors 102A-C, diodes 104A-C, ground 112, MUX 106, amplifier 108, and resistor 110. In some implementations, LIDAR device 400 may also include various additional components including, e.g., scanning element 404 and analysis element 412, among other components. Although the various elements of LIDAR device 400 may be described herein as separate elements, it should be understood that the elements could just as well be physically integrated together or distributed in any suitable manner.

Laser source 402 may be any suitable device/component capable of emitting a laser light beam. Laser source 402 may be configured to emit a continuous laser light beam and/or laser pulses. The laser source 402 may be a gas laser, a chemical laser, a solid-state laser, or a semiconductor laser diode ("laser diode"), among other possible laser types.

Further, laser source 402 may include any suitable number of and/or combination of laser devices. For example, laser source 402 may include multiple laser diodes and/or multiple solid-state lasers. Laser source 402 may be configured to emit a light beam at a particular wavelength and/or wavelength range. For example, laser source 402 may include at least one laser diode configured to emit a light signal in a defined wavelength range. The particular wavelength range may include a wavelength of at least one of about 905 nm and about 1550 nm. These example wavelengths are discussed for purposes of example and explanation only, and should not be taken to be limiting. Other wavelengths are possible as well.

Scanning element 404 may be any suitable device/system capable of directing the laser light beam emitted from the laser source 402. Scanning element 404 may be configured to have a particular scan angle. The scan angle may include an azimuth angle and/or an elevation angle. Accordingly, scanning element 404 may be configured to direct the laser light beam in various directions/motions. Scanning element 404 may include at least one mirror and/or other optical reflector. Scanning element 404 may include other components and/or may be coupled to other systems as well.

As discussed above, circuit architecture 410 may be the example circuit architecture described above with reference to FIGS. 1A and 1B. Accordingly, photosensors 102A-C may be configured to receive a light signal having wavelengths in a defined wavelength range, such as the wavelengths discussed above with reference to laser source 402. Again, however, these wavelengths are set forth for purposes of example only and thus should not be taken to be limiting. Other wavelengths are possible.

Analysis element 412 may include a variety of components, devices, and/or systems configured to receive and analyze a signal that it receives from the circuit architecture 410. For example, analysis element 412 may include filters, amplifiers, analog-to-digital converters, and/or other electrical components. In some implementations, analysis element 412 may be configured to generate spatial-point data and/or detect objects. In other implementations, the analysis element 412 may include, or be coupled to, a sensing system that is distinct from circuit architecture 410. Other examples may exist.

In operation, in accordance with the example described above with respect to FIGS. 2A and 2B, laser source 402 may output a light signal at a defined wavelength. Scanning element 404 may then redirect the light signal towards an environment surrounding LIDAR device 400. The light signal may propagate in the environment and reflect off of objects within the environment. The objects may be located at varying distances away from LIDAR device 400, such that near objects may provide a stronger reflected light signal than far objects, due to attenuation.

Circuit architecture 410 may receive light signals of varying wavelengths and varying strengths. When one of the photosensors 102A-C detects a light signal at the defined wavelength range (i.e., a reflected light signal), the photosensor may convert the light signal into current and the current signal may pass through circuit architecture 410 as discussed above with reference to circuit architecture 100 of FIG. 1.

Accordingly, circuit architecture 410 may then output a voltage signal to the input of the analysis element 412. Analysis element 412 may then perform a variety of functions/operations with the voltage signal. In some implementations, the voltage signal may be filtered, amplified, converted, and/or analyzed. In some implementations, analysis element 412 may generate point-cloud data based on the voltage signal. Analysis element 412 may generate other data as well.

In some implementations, LIDAR device 400 may be integrated with an autonomous vehicle such that an output of circuit architecture 410 and/or analysis element 412 may be coupled to an input of another autonomous vehicle subsystem.

IV. CONCLUSION

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

The invention claimed is:

1. A circuit comprising:
   at least one photosensor, each photosensor comprising an input that is configured to receive an optical signal;
   a respective diode coupled to each photosensor, each respective diode comprising an input that is coupled to an output of the coupled photosensor;
   a multiplexer comprising an input that is coupled to the output of each of the at least one photosensor; and
   an amplifier comprising an input that is coupled to the output of the multiplexer.

2. The circuit of claim 1, wherein the at least one photosensor comprises at least one photodiode.

3. The circuit of claim 2, wherein the at least one photodiode comprises at least one avalanche photodiode.

4. The circuit of claim 1, wherein the at least one photosensor includes at least ten photosensors.

5. The circuit of claim 1, wherein an output of each respective diode is coupled to ground.

6. The circuit of claim 1, wherein the input of the amplifier that is coupled to the output of the multiplexer is a negative input.

7. The circuit of claim 6, wherein the amplifier comprises a negative feedback loop.

8. The circuit of claim 7, wherein the negative feedback loop comprises a resistor.

9. The circuit of claim 1, wherein the amplifier is a transimpedance amplifier.

10. The circuit of claim 1, wherein an output of the amplifier is coupled to an analysis element of a light-detection and ranging device.

11. A light-detection and ranging (LIDAR) device, comprising:
   at least one laser source, wherein the at least one laser source is configured to emit a light signal in a defined wavelength range;
   at least one photosensor, each photosensor comprising an input that is configured to receive a light signal having wavelengths in the defined wavelength range;
   a respective diode coupled to each photosensor, each respective diode comprising an input that is coupled to an output of the coupled photosensor;
   a multiplexer comprising an input that is coupled to the output of each of the at least one photosensor; and
   an amplifier comprising an input that is coupled to the output of the multiplexer.

12. The LIDAR device of claim 11, wherein the defined wavelength range includes a wavelength of at least one of about 905 nanometers and about 1550 nanometers.

13. The LIDAR device of claim 11, wherein the at least one photosensor comprises at least one photodiode.

14. The LIDAR device of claim 11, wherein the at least one photosensor includes at least ten photosensors.

15. The LIDAR device of claim 11, wherein an output of each respective diode is coupled to ground.

16. The LIDAR device of claim 11, wherein the input of the amplifier that is coupled to the output of the multiplexer is a negative input.

17. The LIDAR device of claim 16, wherein the amplifier comprises a negative feedback loop.

18. The LIDAR device of claim 17, wherein the negative feedback loop comprises a resistor.

19. The LIDAR device of claim 11, wherein the amplifier is a trans-impedance amplifier.

20. The LIDAR device of claim 11, wherein an output of the amplifier is coupled to an analysis element of the LIDAR device.

21. A circuit comprising:
 one, and only one, photosensor, the photosensor comprising an input that is configured to receive an optical signal;
 a respective diode coupled to the photosensor, the respective diode comprising an input that is coupled to an output of the photosensor; and
 an amplifier comprising an input that is coupled to the output of the photosensor.

22. The circuit of claim 21, wherein the photosensor comprises a photodiode.

23. The circuit of claim 21, wherein an output of the amplifier is coupled to an analysis element of a light-detection and ranging device.

* * * * *